(12) United States Patent
Yoo

(10) Patent No.: US 11,953,520 B2
(45) Date of Patent: Apr. 9, 2024

(54) SEMICONDUCTOR CHIP TEST SOCKET

(71) Applicant: MICRO CONTACT SOLUTION CO., LTD., Cheonan-si (KR)

(72) Inventor: Kyung Hoon Yoo, Cheonan-si (KR)

(73) Assignee: MICRO CONTACT SOLUTION CO., LTD. (KR)

( * ) Notice: Subject to any disclaimer, the term of this patent is extended or adjusted under 35 U.S.C. 154(b) by 0 days.

(21) Appl. No.: 17/938,411

(22) Filed: Oct. 6, 2022

(65) Prior Publication Data

US 2023/0113023 A1 Apr. 13, 2023

(30) Foreign Application Priority Data

Oct. 8, 2021 (KR) .......................... 10-2021-0134453

(51) Int. Cl.
*G01R 1/04* (2006.01)
(52) U.S. Cl.
CPC .................................. *G01R 1/0466* (2013.01)
(58) Field of Classification Search
CPC .................................................. G01R 1/0466
See application file for complete search history.

(56) References Cited

U.S. PATENT DOCUMENTS

| | | | |
|---|---|---|---|
| 6,496,014 B1 * | 12/2002 | Cook | G01R 1/0416 324/538 |
| 10,718,809 B1 | 7/2020 | Kim et al. | |
| 11,073,536 B2 | 7/2021 | Chung | |
| 2020/0150148 A1 * | 5/2020 | Chung | H01R 33/76 |

FOREIGN PATENT DOCUMENTS

| | | | | |
|---|---|---|---|---|
| KR | 2011085710 A | * | 7/2011 | |
| KR | 102187265 B1 | * | 7/2021 | ......... G01R 31/2886 |

OTHER PUBLICATIONS

Translation of KR102187265B1 (Year: 2020).*

* cited by examiner

*Primary Examiner* — Paresh Patel
(74) *Attorney, Agent, or Firm* — Perman & Green, LLP

(57) ABSTRACT

Provided is a semiconductor chip test socket configured to be coupled to a test circuit board for testing a semiconductor chip and provided with an integrated circuit (IC) chip having unique information and an algorithm for counting the number of times the semiconductor chip test socket is used, such that the number of times the semiconductor chip test socket is used may be exactly counted, and the IC chip may be easily installed and removed and securely protected from external impacts.

4 Claims, 9 Drawing Sheets

SEMICONDUCTOR CHIP TEST SOCKET

CROSS-REFERENCE TO RELATED APPLICATION

This application is based on and claims priority under 35 U.S.C. § 119 to Korean Patent Application No. 10-2021-0134453, filed on Oct. 8, 2021, in the Korean Intellectual Property Office, the disclosure of which is incorporated by reference herein in its entirety.

BACKGROUND

1. Field

One or more embodiments relate to a semiconductor chip test socket, and more particularly, to a semiconductor chip test socket configured to be coupled to a test circuit board for testing a semiconductor chip and provided with an integrated circuit (IC) chip having unique information and an algorithm for counting the number of times the semiconductor chip test socket is used, such that the number of times the semiconductor chip test socket is used may be exactly counted, and the IC chip may be easily installed and removed and securely protected from external impacts.

2. Description of the Related Art

After manufacturing processes, semiconductor devices are tested to evaluate the electrical performance thereof.

In such a test process, semiconductor chip test sockets are used. Semiconductor chips conforming to the specifications of the semiconductor chip test sockets are respectively mounted on the semiconductor chip test sockets and are then tested.

Such a semiconductor chip test socket includes: a plurality of connection terminals electrically connectable to electrical terminals of a semiconductor chip; and a fixing member (for example, a lever or the like) capable of fixing the semiconductor chip. The connection terminals and the fixing member are worn by friction and heat during a test process. Therefore, semiconductor chip test sockets are usable only within a given lifespan and a given number of times of use.

However, semiconductor chip test sockets of the related art are not provided with devices configured to exactly indicate specifications, lifespans, and the number of times of use. Therefore, a semiconductor chip test socket having specifications not suitable for testing semiconductor chips may be coupled to a test circuit board, causing semiconductor chip test errors and accidents. In addition, even a semiconductor chip test socket having reached the end of the lifespan thereof may be used for testing semiconductor chips, and in this case, various accidents and defects may occur.

For example, when a semiconductor chip test socket not capable of detecting defects is used for testing semiconductor chips, the quality of the semiconductor chips is not guaranteed. In this case, products including the semiconductor chips may have defects or cause accidents.

Although semiconductor chip test sockets containing various pieces of data have been developed, the semiconductor chip test sockets are still unsatisfactory.

PRIOR DOCUMENT

Patent Document

Korean Patent Application Laid-Open No. 10-2011-0085710

SUMMARY

One or more embodiments include a semiconductor chip test socket configured to be coupled to a test circuit board for testing a semiconductor chip and provided with an integrated circuit (IC) chip having unique information and an algorithm for counting the number of times the semiconductor chip test socket is used, such that the number of times the semiconductor chip test socket is used may be exactly counted, and the IC chip may be easily installed and removed and securely protected from external impacts.

Additional aspects will be set forth in part in the description which follows and, in part, will be apparent from the description, or may be learned by practice of the presented embodiments of the disclosure.

According to one or more embodiments, a semiconductor chip test socket is configured to be coupled to a test circuit board for testing a semiconductor chip and provided with an integrated circuit (IC) chip, the IC chip having unique information and an algorithm for counting the number of times the semiconductor chip test socket is used. The semiconductor chip test socket includes: a socket body including an installation portion in which the IC chip is installed; a side body coupled to the socket body and covering the installation portion; a fixing member, which is installed in the installation portion and to which the IC chip is fixed; and a pogo pin installed in the socket body with an end of the pogo pin being connected to the IC chip and another end of the pogo pin protruding outward from the socket body to connect the IC chip to a test circuit board provided outside of the semiconductor chip test socket, wherein when the semiconductor chip test socket is coupled to the test circuit board, the pogo pin is connected to the test circuit board, the IC chip is electrically connected to the test circuit board, and the unique information and the number of times the semiconductor chip test socket is used are transmitted to the test circuit board.

According to an embodiment, the installation portion may include a vertical through-hole, and the fixing member may be installed into the installation portion from an upper side and fixed in position while being supported inside the installation portion.

According to an embodiment, the fixing member may include: a bottom panel; and a side panel provided on a side of the bottom panel and extending upward therefrom, wherein the bottom panel may include a contact installation hole portion vertically formed through the bottom panel, the bottom panel may support a bottom surface of the IC chip, the side panel may support a side surface of the IC chip, and the pogo pin may be accommodated in the contact installation hole portion and fixed in position.

According to an embodiment, the contact installation hole portion may include a support surface configured to support at least a portion of the pogo pin.

According to an embodiment, the bottom panel may include a fixing protrusion protruding downward from a lower surface of the bottom panel, and when the fixing member is installed in the installation portion, the fixing protrusion may be exposed at a lower side of the socket body.

According to an embodiment, the contact installation hole portion may vertically penetrate the fixing protrusion.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
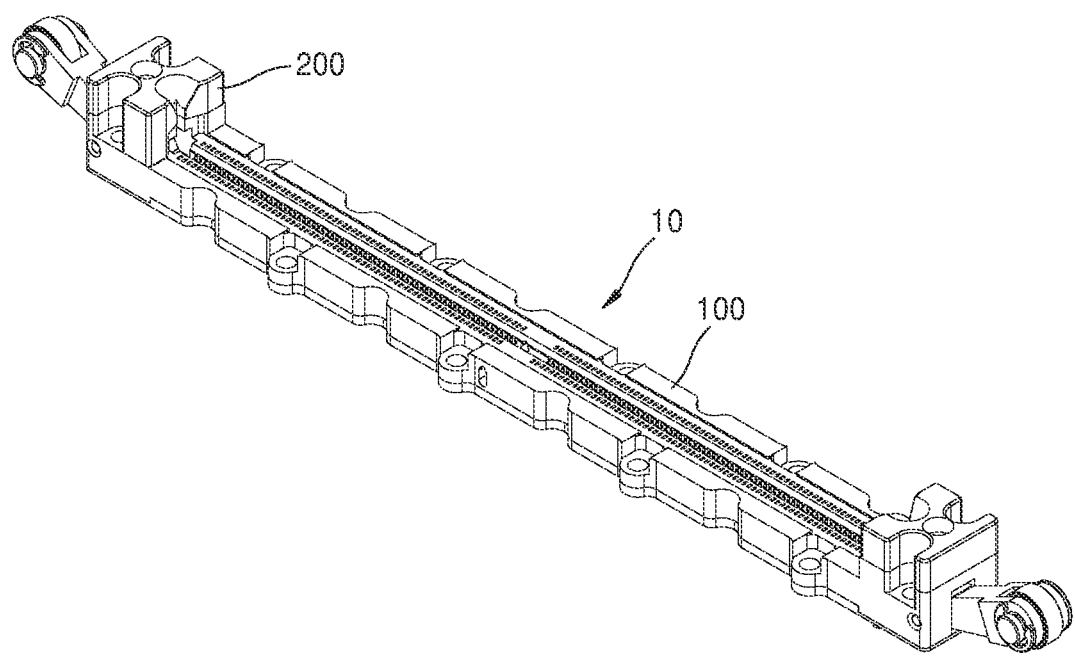
FIGS. 1 to 5 are views illustrating a structure of a semiconductor chip test socket according to embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Hereinafter, embodiments will be described with reference to the accompanying drawings.

Figure 4:
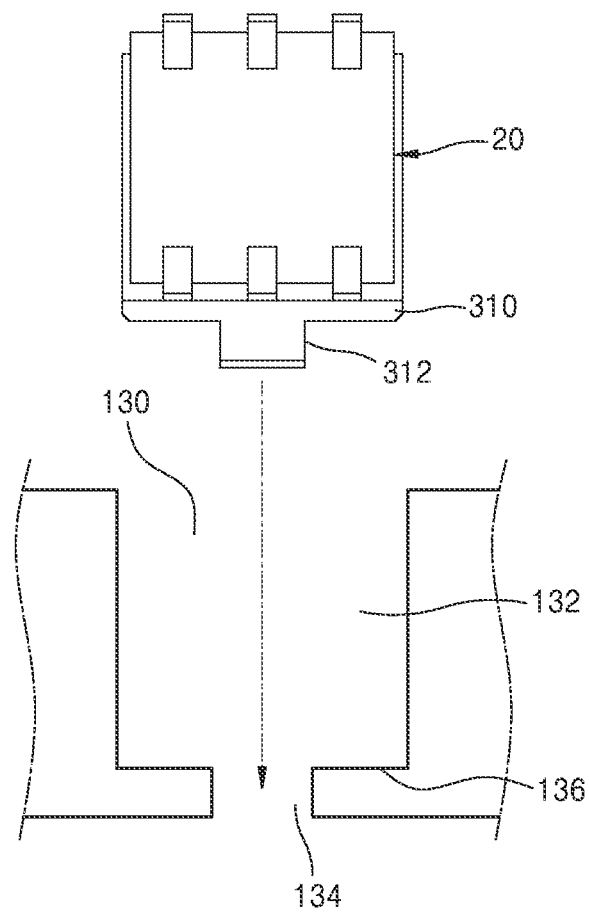
Figure 5:
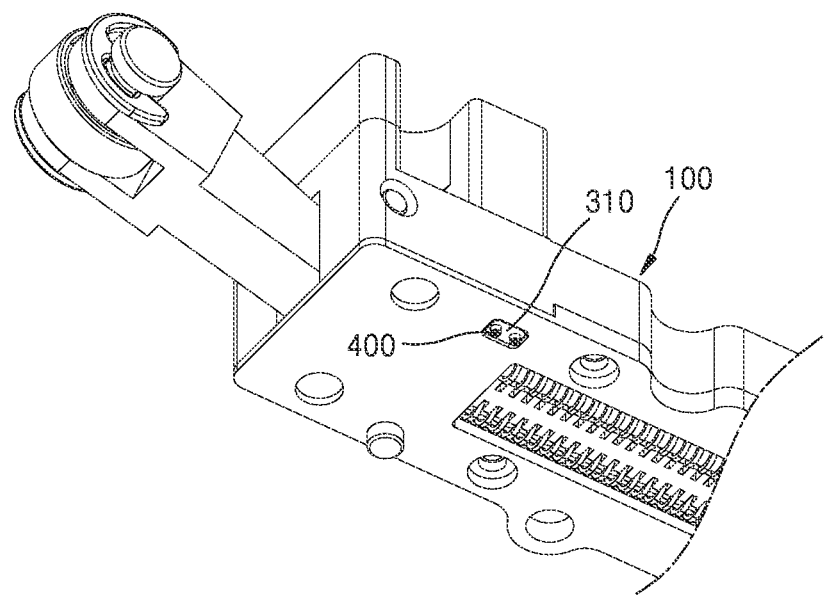
Figure 6:
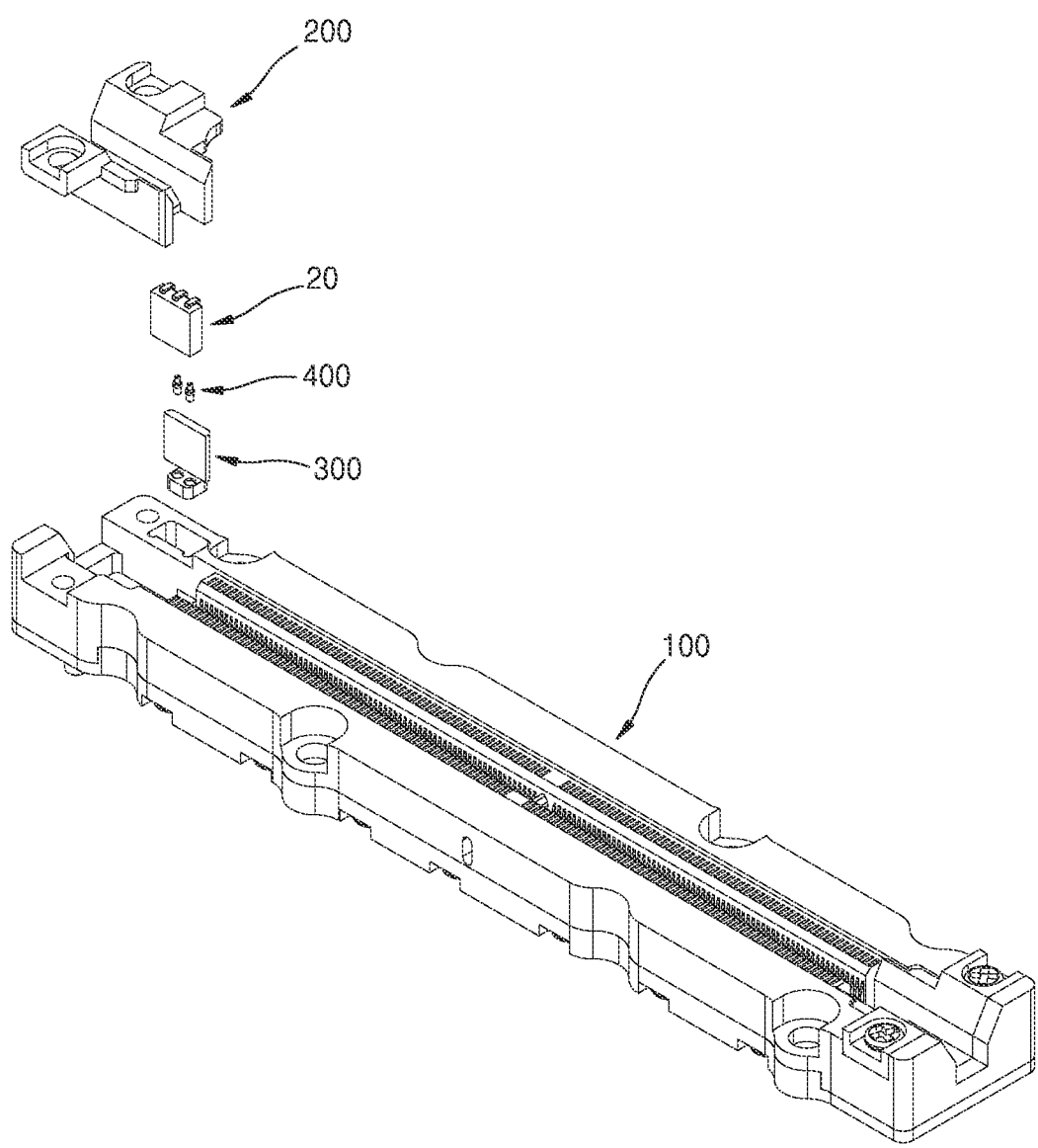
FIGS. 6 to 8 are views illustrating another structure of the semiconductor chip test socket according to other embodiments.
Figure 7:
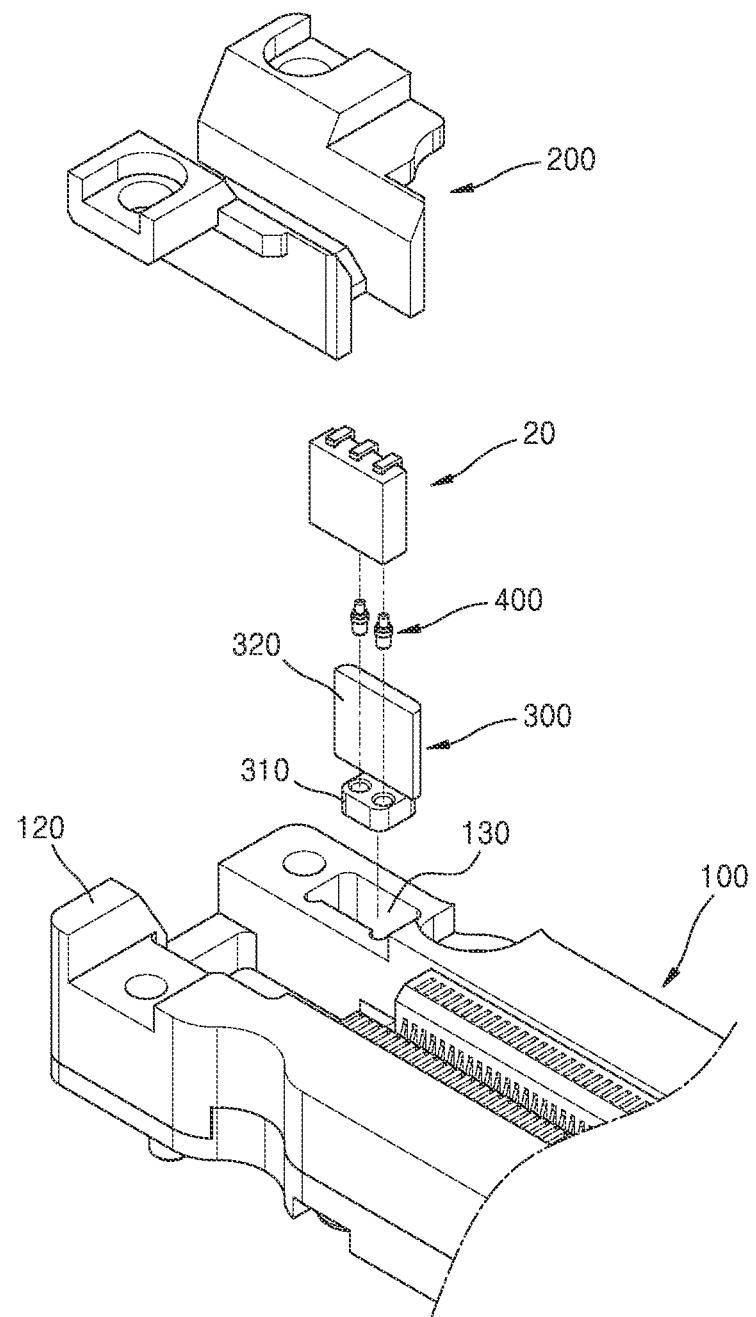
Figure 8:
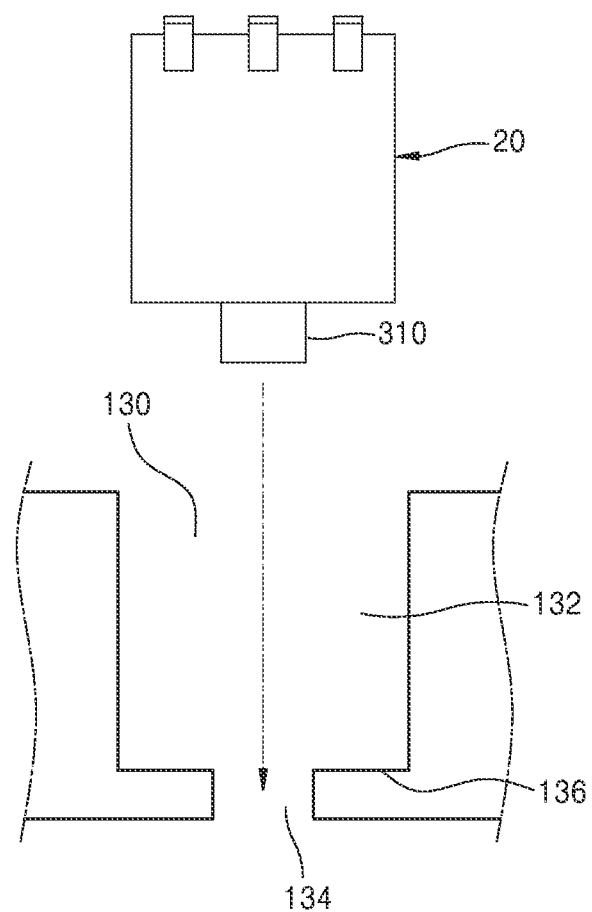

FIGS. 1 to 5 are views illustrating a structure of a semiconductor chip test socket 10 according to embodiments. FIGS. 6 to 8 are views illustrating another structure of the semiconductor chip test socket 10 according to other embodiments.

Figure 2:
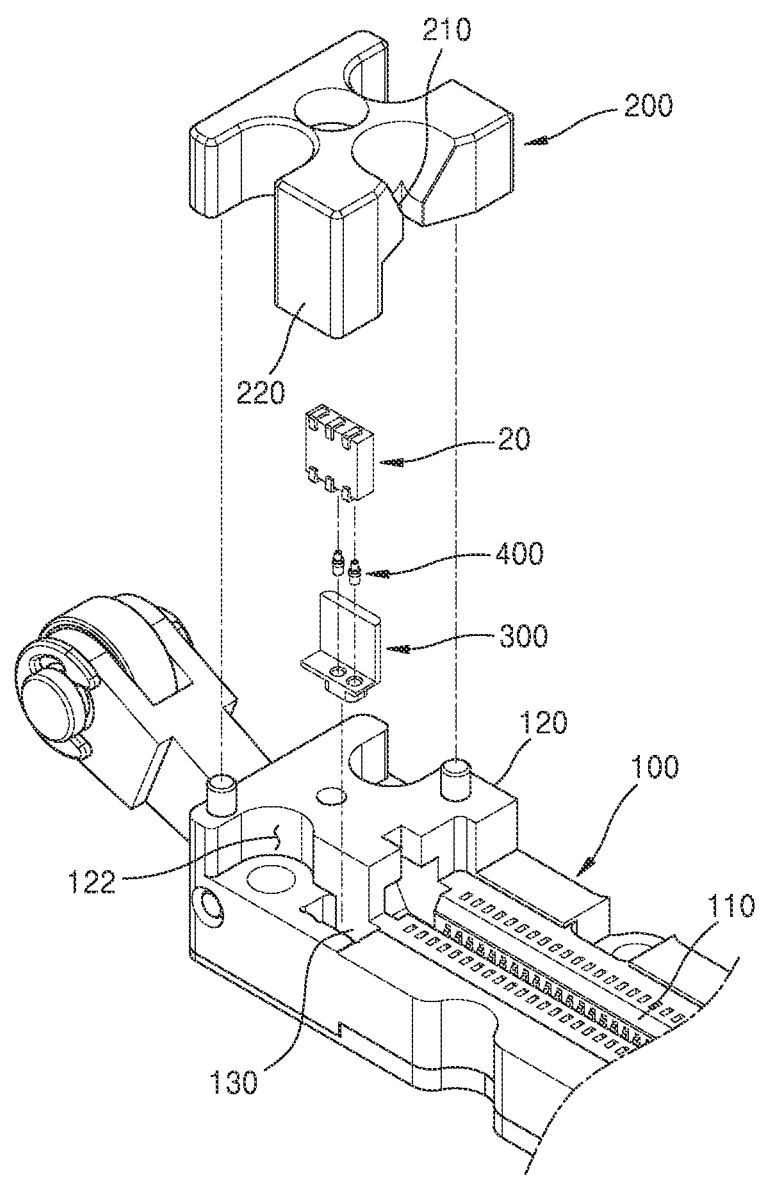
Figure 3:
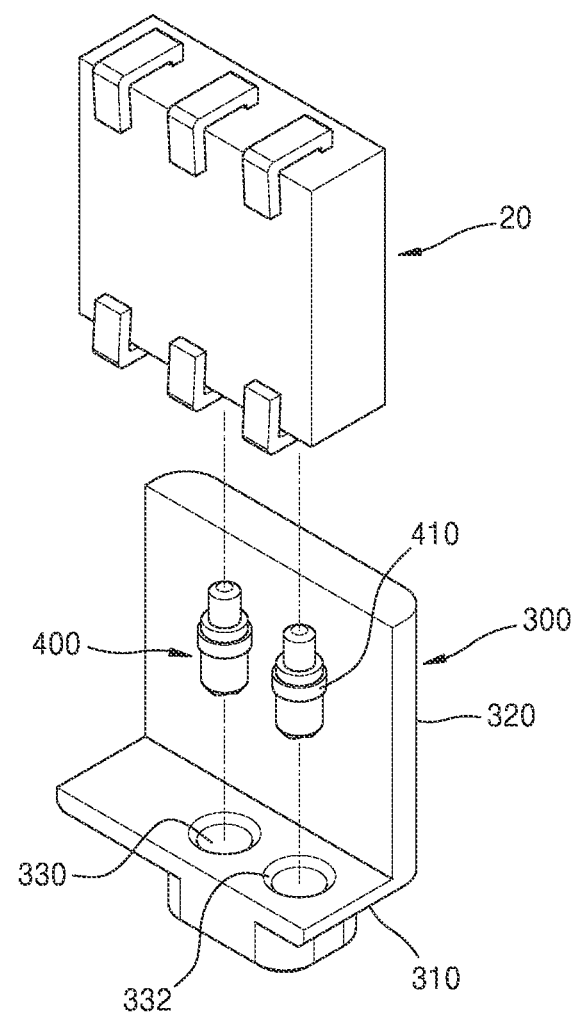

For example, FIG. 1 is a view illustrating the overall shape of the semiconductor chip test socket 10 according to an embodiment. FIGS. 2 to 4 are exploded perspective views illustrating the semiconductor chip test socket 10 according to embodiments. FIG. 5 is a bottom perspective view illustrating the shape of a lower side of the semiconductor chip test socket 10 according to an embodiment. FIGS. 6 to 8 are exploded perspective views illustrating the semiconductor chip test socket 10 according to other embodiments.

According to an embodiment, the semiconductor chip test socket 10 includes: a socket body 100; a side body 200 coupled to each of both sides of an upper surface of the socket body 100; a fixing member 300 to which an integrated circuit (IC) chip 20 is fixable; and pogo pins 400.

The socket body 100 may have a block shape having a long length from side to side.

A mount portion 110 is provided on the socket body 100. The mount portion 110 includes a groove that is open upward and recessed downward, and a semiconductor chip may be mounted on the mount portion 110. The mount portion 110 includes a plurality of connection terminals, which are connectable to electrical terminals of a semiconductor chip. For example, the connection terminals may be contact members (not shown).

A side portion 120 may be provided on each of both sides of the upper surface of the socket body 100 such that the side body 200 (described layer) may be stably placed on and fixed to the side portion 120. The side portion 120 may include fixing parts for fixing the side bodies 200. The fixing parts may be, for example, protrusions or screws, but are not limited thereto.

An installation portion 130 is formed in the socket body 100. The installation portion 130 includes a recess in which the IC chip 20 is installable. The installation portion 130 may be open upward and may have a given depth. Therefore, the IC chip 20 and the fixing member 300 may be inserted into the installation portion 130.

In addition, the installation portion 130 may include a vertical through-hole. In this case, a lower portion of the installation portion 130 may have a smaller cross-sectional area than an upper portion of the installation portion 130. For example, as shown in FIG. 4, the installation portion 130 may have an upper space 132 in the upper portion thereof and a lower space 134 in the lower portion thereof, and the cross-sectional area of the upper space 132 may be greater than the cross-sectional area of the lower space 134. Therefore, a support surface 136 may be provided on a portion between the upper space 132 and the lower space 134 of the installation portion 130. When the fixing member 300 (described later) is installed in the installation portion 130, the support surface 136 may support a lower portion of the fixing member 300. Therefore, when the fixing member 300 is installed in the installation portion 130, a portion of the fixing member 300 may be supported on the support surface 136 of the installation portion 130, and the position of the fixing member 300 may be fixed.

In an embodiment, as shown in FIG. 2, the installation portion 130 may be formed in a portion of the side portion 120 of the socket body 100. In an embodiment, the installation portion 130 may be formed in one of side portions 120 of the socket body 100.

The side body 200 is a member configured to be fixed to the socket body 100.

The shape of the side body 200 is not limited. According to an embodiment, the side body 200 may be a block-shaped member. According to an embodiment, the semiconductor chip test socket 10 may include two side bodies 200, and the two side bodies 200 may be respectively fixed to side portions 120 provided on both sides of the socket body 100.

According to an embodiment, a guide groove 210 may be formed in the side body 200. The guide grooves 210 may extend in a vertical direction. According to an embodiment, ide grooves 210 may be formed in mutually-facing surfaces of two side bodies 200. When a semiconductor chip is mounted on the socket body 100, the guide groove 210 may guide the semiconductor chip. In addition, the guide groove 210 may fix the position of the semiconductor chip mounted on the socket body 100.

The coupling between the side body 200 and the socket body 100 is not limited to a particular form. For example, as shown in FIG. 2, the side body 200 may include a protruding solid 220, and the socket body 100 may include a recessed solid 122. Therefore, the socket body 100 and the side body 200 may be stably coupled to each other in position.

For example, in another embodiment, as shown in FIG. 6, the side body 200 may have a cover shape to merely cover the side portion 120 of the socket body 100.

Once the side body 200 is coupled to the socket body 100, the installation portion 130 may be covered by the side body 200. In addition, the fixing member 300 and the IC chip 20 which are inserted into the installation portion 130 may also be covered by the side body 200.

Owing to this structure, an additional cover member may not be used for covering the IC chip 20, and the IC chip 20 may fixed and protected by inserting the IC chip 20 into the semiconductor chip test socket 10.

The fixing member 300 is a member capable of supporting the IC chip 20 and fixing the IC chip 20 to the inside of the installation portion 130. When the fixing member 300 is installed in the installation portion 130, at least a portion of the fixing member 300 may be fixed in position while being supported inside the installation portion 130. For example, as described above, the installation portion 130 may include the vertical through-hole and the support surface 136, and thus the fixing member 300 may be fixed in position while being supported on the support surface 136 inside the installation portion 130. Thus, as shown in FIG. 4, a portion of the lower side of the fixing member 300 may be supported and fixed in position by the support surface 136 of the installation portion 130, and the other portion of the lower side of the fixing member 300 may be exposed at a lower surface of the socket body 100. Therefore, the IC chip 20 and the fixing member 300 may be easily fixed to the socket body 100, and moreover, the IC chip 20 and the fixing member 300 may be easily separated from the socket body 100.

The fixing member 300 may include: a bottom panel 310 configured to support a bottom surface of the IC chip 20; and a side panel 320 configured to support a side surface of the IC chip 20. Therefore, according to an embodiment, the fixing member 300 may have an "L" shape when viewed from a side. However, embodiments are not limited thereto.

In addition, although not shown in the drawings, the fixing member 300 may include a fixing structure for fixing the IC chip 20. The fixing structure may be, for example, a protrusion to which the IC chip 20 may be fitted or a groove into which the IC chip 20 may be inserted.

The bottom panel 310 may include contact installation hole portions 330. The contact installation hole portions 330 may vertically penetrate the bottom panel 310. Pogo pins 400 (described later) may be fixed to the contact installation hole portions 330. The contact installation hole portions 330 may be configured to accommodate and fix the pogo pins 400. For example, the contact installation hole portions 330 may be vertical through-hole portions capable of supporting at least portions of the pogo pins 400. For example, the contact installation hole portions 330 may have inwardly-protruding support protrusions, or support structures such as support surfaces 332 formed along upper peripheries of the contact installation hole portions 330. In addition, the pogo pins 400 may also include support portions, which protrude laterally from sides of the pogo pins 40.

In an embodiment, the bottom panel 310 may include a fixing protrusion 312. The fixing protrusion 312 may be provided on a lower side of the bottom panel 310 and may protrude downward. When the fixing member 300 is installed in the installation portion 130, the fixing protrusion 312 may be fixed to at least a portion of the installation portion 130, and thus the position of the fixing member 300 may be fixed. For example, the fixing protrusion 312 may be placed in the lower space 134 of the installation portion 130.

When the fixing member 300 is installed in the installation portion 130, the fixing protrusion 312 may be exposed at a lower side of the socket body 100 as shown in FIG. 5. Therefore, the state in which the pogo pins 400 are fixed to the fixing member 300 may be easily checked, and the IC chip 20 and the fixing member 300 may be easily separated from the socket body 100. For example, after the fixing member 300 is fitted to the installation portion 130, it may not be easy to remove the fixing member 300 from the installation portion 130. However, owing to the structure described in the above embodiment, the fixing member 300 may be easily removed from the installation portion 130 by upwardly pushing the fixing protrusion 312 which is exposed at the lower side of the socket body 100.

In addition, according to an embodiment shown in FIGS. 7 and 8, the bottom panel 310 may not additionally include the fixing protrusion 312. In this embodiment, the bottom panel 310 may be placed in the lower space 134 of the installation portion 130.

The pogo pins 400 are connection terminals capable of connecting the IC chip 20 to a test circuit board (not shown), and are not limited to a specific structure as long as the pogo pins 400 are capable of transmit electrical signals.

The pogo pins 400 may be inserted into the contact installation hole portions 330 formed in the bottom panel 310 of the fixing member 300, and may be fixed inside the contact installation hole portions 330.

As shown in FIG. 5, upper ends of the pogo pins 400 are connected to the IC chip 20 installed in the installation portion 130, and lower ends of the pogo pins 400 are exposed at the lower side of the socket body 100. The lower ends of the pogo pins 400 exposed at the lower side of the socket body 100 may be connected to a test circuit board (not shown), which is placed under the socket body 100.

Owing to this structure, the pogo pins 400 may be installed in the socket body 100 without directly inserting the pogo pins 400 into the socket body 100. That is, according to an embodiment, an assembling process may be performed by inserting the pogo pins 400 inserted into the contact installation hole portions 330 of the fixing member 300, and then inserting the fixing member 300, into which the pogo pins 400 are inserted, into the installation portion 130 of the socket body 100. Alternatively, an assembling process may be performed by inserting an assembly of the IC chip 20, the fixing member 300, and the pogo pins 400 into the installation portion 130.

Therefore, the IC chip 20, the fixing member 300, and the pogo pins 400, which are relatively small components, may be easily installed in the socket body 100. That is, the overall assemblability of the semiconductor chip test socket 10 may be improved. In addition, loss of components of the semiconductor chip test socket 10 may be prevented, and thus manufacturing and operating costs may be reduced.

The IC chip 20 may have unique information and an algorithm for counting the number of times the semiconductor chip test socket 10 is used. Here, the unique information may include, for example, a number assigned according to a specification. The unique information and the algorithm may be input to the IC chip 20 by a separate device.

When the IC chip 20 having the unique information is installed, the unique information may be allocated to the semiconductor chip test socket 10. In addition, the number of times the semiconductor chip test socket 10 is used may be counted by the IC chip 20. In this case, the number of times the semiconductor chip test socket 10 is used may be counted by, for example, counting the number of times of signal exchange when the IC chip 20 is connected to a test circuit board V (described later) and exchanges signals with the test circuit board V. However, this is a non-limiting example.

Figure 9:
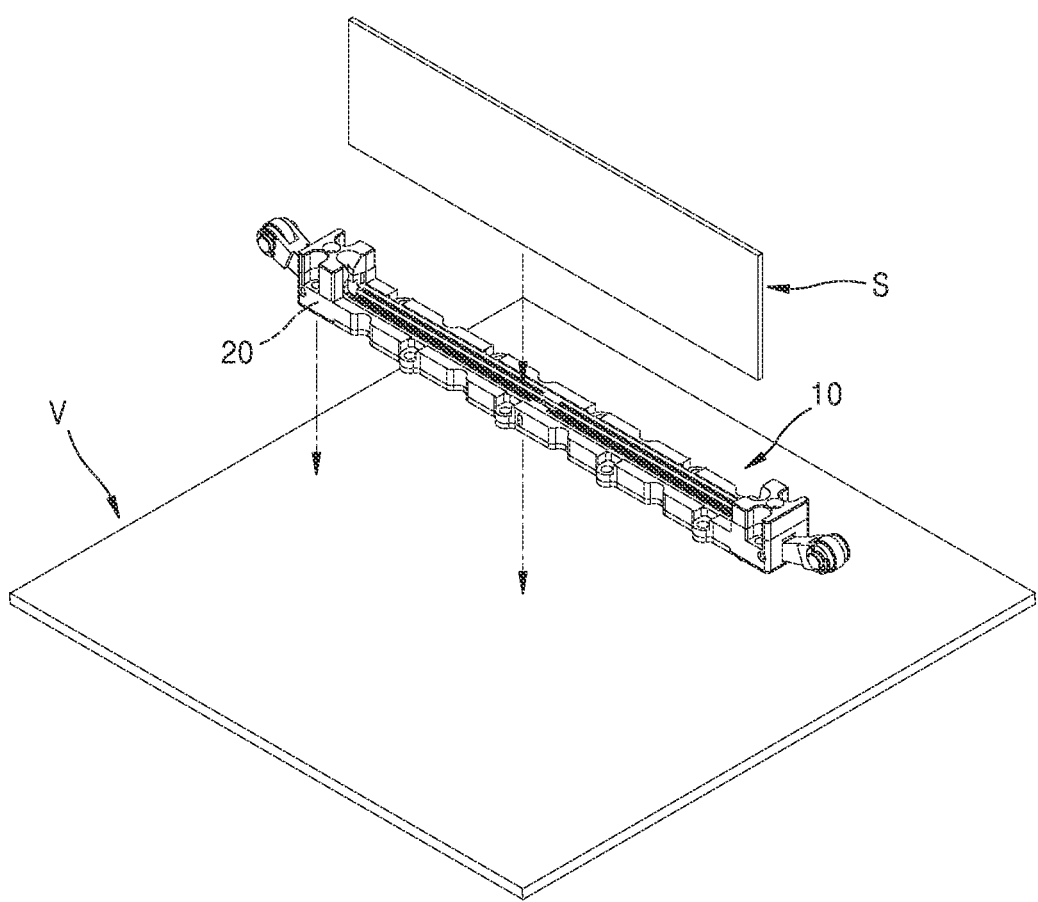
FIG. 9 is a view illustrating how a semiconductor chip test socket is mounted on a test circuit board according to an embodiment.

FIG. 9 is a view illustrating how the semiconductor chip test socket 10 is mounted on a test circuit board V according to an embodiment.

The test circuit board V may be a printed circuit board (PCB) on which the semiconductor chip test socket 10 may be installed for exchanging signals with the PCB. The test circuit board V may include a system configured to display the unique information of the IC chip 20 provided in the semiconductor chip test socket 10 and the number of times the semiconductor chip test socket 10 is used. Instead of including the system, the test circuit board V may be connected to an external device and may transmit and receive signals to and from the external device.

When the semiconductor chip test socket 10 is coupled to the test circuit board V, the IC chip 20 and the test circuit board V are electrically connected to each other through the pogo pins 400. To this end, the test circuit board V may include connection recesses (not shown) into which lower end portions of the pogo pins 400 are insertable for electrical connection with the test circuit board V.

A semiconductor chip package S is mounted on the semiconductor chip test socket 10. Then, the semiconductor chip package S and the test circuit board V are connected to each other through the semiconductor chip test socket 10, and thus the semiconductor chip package S may be tested.

The unique information and data on the number of times of use of the semiconductor chip test socket 10 may be transmitted from the IC chip 20 to the system of the test circuit board V.

Hereinafter, effects of the embodiments will be described.

According to the embodiments, the IC chip 20 is provided in the semiconductor chip test socket 10, and the IC chip 20 may assign unique information to the semiconductor chip test socket 10 and count the number of times the semiconductor chip test socket 10 is used.

Therefore, the number of times the semiconductor chip test socket 10 is used may be exactly counted, and thus defects of the semiconductor chip test socket 10 and semiconductor chip package products may be prevented in advance. For example, when the semiconductor chip test socket 10 is moved and used together with another test circuit board V, the number of times of use of the semiconductor chip test socket 10 may be cumulatively counted. Therefore, the remaining service life of the semiconductor chip test socket 10 may be exactly checked, and thus defects of the semiconductor chip test socket 10 and semiconductor chip package products may be prevented.

In addition, according to the embodiments, owing to the fixing member 300 which is configured to support the IC chip 20 and is fixable to the installation portion 130, assemblability may be improved when installing the IC chip 20 and the pogo pins 400. In addition, because the IC chip 20 is supported by the fixing member 300, the IC chip 20 may be fixed to the inside of the installation portion 130 of the socket body 100. That is, even when an external force is unintentionally applied to the semiconductor chip test socket 10, the IC chip 20 may not be displaced.

As described above, according to the one or more of the above embodiments, the semiconductor chip test socket 10 includes the IC chip 20 configured to assign unique information to the semiconductor chip test socket 10 and count the number of times the semiconductor chip test socket 10 is used.

Therefore, the number of times the semiconductor chip test socket 10 is used may be exactly counted, and thus defects of the semiconductor chip test socket 10 and semiconductor chip package products may be prevented in advance.

Furthermore, because the semiconductor chip test socket 10 of the embodiments includes the fixing member 300 configured to fix the IC chip 20, the IC chip 20 may be easily installed and removed and may be securely protected from external impacts.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A semiconductor chip test socket configured to be coupled to a test circuit board for testing a semiconductor chip and provided with an integrated circuit (IC) chip, the IC chip having unique information and an algorithm for counting the number of times the semiconductor chip test socket is used, the semiconductor chip test socket comprising:
   a socket body comprising an installation portion in which the IC chip is installed;
   a side body coupled to the socket body and covering the installation portion;
   a fixing member, which is installed in the installation portion and to which the IC chip is fixed; and
   a pogo pin installed in the socket body with an end of the pogo pin being connected to the IC chip and another end of the pogo pin protruding outward from the socket body to connect the IC chip to a test circuit board provided outside of the semiconductor chip test socket,
   wherein when the semiconductor chip test socket is coupled to the test circuit board, the pogo pin is connected to the test circuit board, the IC chip is electrically connected to the test circuit board, and the unique information and the number of times the semiconductor chip test socket is used are transmitted to the test circuit board;
   wherein the installation portion comprises a vertical through-hole, and the fixing member is installed into the installation portion from an upper side and is fixed in position while being supported inside the installation portion,
   wherein the pogo pin is placed below the installation portion and has an upper end connected to the IC chip installed in the installation portion and a lower end exposed at a lower side of the socket body,
   wherein the fixing member comprises:
      a bottom panel, and
      a side panel provided on a side of the bottom panel and extending upward therefrom,
      wherein the bottom panel comprises a contact installation hole portion vertically formed through the bottom panel,
      wherein the bottom panel supports a bottom surface of the IC chip, and the side panel supports a side surface of the IC chip, and
      wherein the pogo pin is accommodated in the contact installation hole portion and fixed in position.

2. The semiconductor chip test socket of claim 1, wherein the contact installation hole portion comprises a support surface configured to support at least a portion of the pogo pin.

3. The semiconductor chip test socket of claim 1, wherein the bottom panel comprises a fixing protrusion protruding downward from a lower surface of the bottom panel, and when the fixing member is installed in the installation portion, the fixing protrusion is exposed at a lower side of the socket body.

4. The semiconductor chip test socket of claim 3, wherein the contact installation hole portion vertically penetrates the fixing protrusion.

\* \* \* \* \*